United States Patent [19]

MacDowell

[11] Patent Number: 4,861,734
[45] Date of Patent: Aug. 29, 1989

[54] ALKALINE EARTH ALUMINOBORATE GLASS-CERAMICS

[75] Inventor: John F. MacDowell, Penn Yan, N.Y.

[73] Assignee: Corning Incorporated, Corning, N.Y.

[21] Appl. No.: 226,773

[22] Filed: Aug. 1, 1988

[51] Int. Cl.$^4$ .................. C03C 10/02; C03C 3/145
[52] U.S. Cl. ........................................ 501/10; 501/52
[58] Field of Search ................................... 501/10, 52

[56] References Cited

U.S. PATENT DOCUMENTS

| | | | |
|---|---|---|---|
| 1,609,329 | 12/1926 | Taylor | 501/52 |
| 2,090,098 | 8/1937 | Berger et al. | 501/52 |
| 2,899,584 | 8/1959 | Verwey | 501/52 |
| 3,899,340 | 8/1975 | Malmendier | 501/10 |
| 3,948,669 | 4/1976 | Brydges et al. | 501/10 |
| 4,049,872 | 9/1977 | Hang | 501/10 |
| 4,291,107 | 9/1981 | Barry et al. | 501/52 |
| 4,341,849 | 7/1982 | Park et al. | 501/52 |

Primary Examiner—Mark L. Bell
Attorney, Agent, or Firm—Clinton S. Janes, Jr.

[57] ABSTRACT

This invention is directed to the production of glass-ceramic bodies through the sintering of finely-divided glass powders into an integral body accompanied with the generation of crystals therein. The inventive products have compositions consisting essentially, selected from the group, in weight percent, consisting of:

(a) 20–30% CaO, 35–55% $Al_2O_3$, and 20–40% $B_2O_3$;
(b) 30–45% SrO, 30–45% $Al_2O_3$, and 20–35% $B_2O_3$;
(c) 40–55% BaO, 25–40% $Al_2O_3$, and 15–30% $B_2O_3$; and
(d) mixtures thereof.

The predominant crystal phase is an alkaline earth metal aluminoborate.

2 Claims, No Drawings

ALKALINE EARTH ALUMINOBORATE GLASS-CERAMICS

BACKGROUND OF THE INVENTION

Classical glass-ceramics had their genesis in U.S. Pat. No. 2,920,971. As explained there, the production of glass-ceramics contemplates the controlled in situ crystallization of precursor glass bodies and involves three general steps: (1) a glass forming batch customarily containing a nucleating agent is melted; (2) that melt is cooled and simultaneously a glass body of a desired configuration is shaped therefrom; and (3) that glass body is subjected to a predetermined heat treatment which initially develops nuclei in the glass upon which crystals subsequently grow. Because glass-ceramic articles are typically highly crystalline, i.e., greater than about 50% by volume crystalline, the properties exhibited thereby are more closely akin to those of the crystal phase than to those of the parent glass. Furthermore, because classical glass-ceramic articles are prepared through the controlled in situ crystallization of glass articles, they are non-porous and free of voids.

The hallmark of classical glass-ceramic articles consists of the presence of a nucleating agent, e.g., the $TiO_2$ disclosed in U.S. Pat. No. 2,920,971. Whereas the inclusion of a nucleating agent normally insures a high degree of crystallization uniformly distributed throughout the final product, its presence may also contribute undesirable effects. For example, $TiO_2$ is a high temperature flux which can lower the refractoriness of the glass-ceramic. Also, crystals of the nucleating agent, rutile for instance, can form in the glass-ceramic, thereby modifying the properties demonstrated by the glass-ceramic. Finally, the presence of a nucleating agent can lead to the growth of an unwanted crystal phase.

In view of those circumstances, glass-ceramic articles have been produced by sintering glass powders containing no nucleating agent as such into an integral body; instead relying upon surface nucleation from the very finely-divided grains of glass. In general, the glass powders will pass a No. 325 United States Standard Sieve (44 microns) and, most preferably, will have a size not exceeding 10 microns. This production practice permits, with the careful control of glass composition, the fabrication of glass-ceramic articles containing a particularly desired crystallization.

The process for producing glass-ceramic articles by sintering glass powders comprises four general steps: (1) a glass forming batch is melted; (2) that melt is cooled and the resulting glass is comminuted to a very finely-divided powder (commonly termed "frit"); (3) that powder is formed into a desired shape; and (4) that shape is fired at a sufficiently high temperature to sinter the glass particles together into an integral body and to cause the growth of crystals therewithin.

Unfortunately, this last consolidation step has customarily required the use of very high temperatures to produce, without microcracking, essentially void-free and non-porous bodies; i.e., bodies exhibiting substantially theoretical density. For example, $\beta$-spodumene (keatite solid solutions) materials contain large amounts of $Li_2O$ and are difficult to sinter to high density, as are zinc $\beta$-quartz compositions which demonstrate high expansion hysteresis and must be sintered in the neighborhood of or in excess of 1000° C. Cordierite glass powders are likewise difficult to sinter to near theoretical density unless a second crystal or a glass phase is also present.

SUMMARY OF THE INVENTION

I have discovered glasses having compositions within the $CaO-Al_2O_3-B_2O_3$, the $SrO-Al_2O_3-B_2O_3$, and the $BaO-Al_2O_3-B_2O_3$ systems which, in powder form, can be surface nucleated during sintering to produce glass-ceramic bodies exhibiting very low linear coefficients of expansion, high strength and toughness, and excellent dielectric properties. The forming procedure typically involves compacting glass powders into a desired shape and then firing that shape to a sufficiently high temperature to sinter the glass powder into an integral body and effect crystallization therewithin, thereby yielding a fine-grained glass-ceramic where nucleation of crystals occurs almost entirely at the relict interfaces of deformed glass particles.

The most desirable physical properties have been found to be present in compositions residing in the vicinity of the 1.1.1 $CaO/SrO/BaO.Al_2O_3.B_2O_3$ stoichiometry. The powder compacts of those glasses readily sinter to bodies of high density at relatively low temperatures ($=650°-800°$ C.) before crystallizing in situ to a fine-grained glass-ceramic at temperatures between about 750°-1000° C. The rate and extent of crystallinity developed in the powder compacts increase as the temperature of heat treatment is raised to the solidus temperature. Nevertheless, to avoid the risk of the glass body thermally deforming during the heat treatment, temperatures below the solidus will normally be employed. The solidus temperatures for the $BaO.Al_2O_3.B_2O_3$, $SrO.Al_2O_3.B_2O_3$, and $CaO.Al_2O_3.B_2O_3$ stoichiometries are approximately 900° C., 975° C., and 1050° C., respectively.

The predominant crystal phases believed to be present are alkaline earth metal aluminoborates of 1.1.1 stoichiometry. The calcium and barium aluminoborate phases were readily identified by referencing the X-ray powder diffraction file. The $\alpha$ and $\beta$ forms of $CaAl_2B_2O_7$ (the hexagonal and monoclinic forms, respectively) have been observed, with the $\alpha$ form predominating. Only the monoclinic form of $BaAl_2B_2O_7$ was observed. No literature reference could be found for the X-ray diffraction patterns demonstrated by the crystals present in the strontium aluminoborate glass ceramic articles. Nevertheless, because of similarities noted between the calcium and barium aluminoborates and the strontium aluminoborate patterns, it was conjectured that the likely phases (there were two distinct sets of reflections) were both polymorphs of $SrAl_2B_2O_7$. Further crystallographic analyses comparing the patterns of $CaAl_2B_2O_7$ with those of $SrAl_2B_2O_7$ led to the conclusion that the cubic ($\beta$) form of $SrAl_2B_2O_7$ was most prevalent, but some crystals having a hexagonal ($\alpha$) structure were also present. However, long time exposures of the crystalline body at 950° C. resulted in the essentially complete transformation of the crystals from the $\beta$ to the $\alpha$ form. Consequently, it has been postulated that the hexagonal form is stable below the solidus temperature and that the cubic phase is metastable in the inventive glass-ceramics.

The glass-ceramics of the instant invention exhibit relatively high mechanical strength, as evidenced by modulus of rupture values typically of at least 15,000 psi and often in excess of 20,000 psi. These high strengths are postulated to be the result of the high percentage of crystallization present in the products, viz., greater than 50% and customarily within the range of about 60–80% by volume and sometimes in excess of 80% by volume, and because of the bladed interlocking microstructure of the hexagonal polymorph crystals.

The inventive glass-ceramics display low linear coefficients of thermal expansion. To illustrate: articles prepared by sintering glass powders having compositions in the vicinity of the $BaO.Al_2O_3.B_2O_3$ stoichiometry can manifest linear coefficients of thermal expansion (25°–300° C.) between about $20–35 \times 10^{-7}/°C$.; articles prepared by sintering glass powders having compositions in the vicinity of the $CaO.Al_2O_3.B_2O_3$ stoichiometry can demonstrate linear coefficients of thermal expansion (25°–300° C.) between about $10–25 \times 10^{-7}/°C$.; and articles prepared by sintering glass particles having compositions in the vicinity of the $SrO.Al_2O_3.B_2O_3$ stoichiometry can demonstrate linear coefficients of thermal expansion (25°–300° C.) between about $5–15 \times 10^{-7}/°C$.

It appears that by increasing the severity of the heat treatment applied to the precursor glass bodies, i.e., utilizing higher temperatures and/or longer firing times, the mechanical strength of the body can be enhanced somewhat and the coefficient of thermal expansion reduced. It is conjectured that those improvements result from the development of greater concentrations of crystals in the glass ceramic.

The inventive glass-ceramics exhibit dielectric constants between about 4.0–6.0 and dissipation factors below 0.01 at all frequencies at room temperature, thereby suggesting their utility as substrates for multilayer integrated circuit packages that can closely match silicon in thermal expansion, and that are prepared by means of a tape casting process beginning with finely-divided glass particles.

A most unusual and potentially very useful characteristic observed in the inventive glass-ceramics is their hydrophobicity, especially demonstrated in the CaO- and SrO-containing materials. For example, wetting angles with water in excess of 60° are commonplace and as high as 75° have been measured on several samples. This property suggests their utility as coatings for consumer ware items.

Because of the wide range of linear coefficients of thermal expansion included within the three composition systems, there exists the capability of matching the thermal expansion of products ranging from fused silica ($\approx 5 \times 10^{-7}/°C$.), through such low-expansion glass-ceramics as Corning Code 9607 and Corning Code 9608, two products marketed by Corning Glass Works, Corning, N.Y. specifically for culinary ware, sintered cordierite bodies ($\sim 15 \times 10^{-7}/°C$.), and up to silicon ($\sim 35 \times 10^{-7}/°C$.). Such capability renders them useful as sealing frits or high temperature adhesives for low expansion materials.

In general, to prepare glass-ceramic articles containing the greatest concentration of crystallization and exhibiting the lowest coefficient of thermal expansion, the most preferred precursor glasses will have compositions in the close vicinity of the 1:1:1 stoichiometry of each alkaline earth aluminoborate. Hence, to assure the desired matrix of sintering capabilities and physical properties, the levels of each of the alkaline earth oxide, $Al_2O_3$, and $B_2O_3$ will preferably be maintained within ±0.25 mole of the 1:1:1 stoichiometry. In stoichiometric $CaO.Al_2O_3.SiO_2$, CaO has a value of 24.6 weight %, $Al_2O_3$ has a value of 44.8 weight %, and $B_2O_3$ has a value of 30.6 weight %. In stoichiometric $SrO.Al_2O_3.B_2O_3$, SrO has a value of 37.6 weight %, $Al_2O_3$ has a value of 37.1 weight %, and $B_2O_3$ has a value of 25.3 weight %. In stoichiometric $BaO.Al_2O_3.B_2O_3$, BaO has a value of 47.2 weight %, $Al_2O_3$ has a value of 31.4 weight %, and $B_2O_3$ has a value of 21.4 weight %.

I have found glasses having compositions within the $CaO-Al_2O_3-B_2O_3$ system operable in providing the desired sintering behavior, while also exhibiting excellent physical properties, consisting essentially, expressed in terms of weight percent on the oxide basis, of about 20–30% CaO, 35–55% $Al_2O_3$, and 20–40% $B_2O_3$ With respect to the $SrO-Al_2O_3-B_2O_3$ system, operable glasses consist essentially, expressed in terms of weight percent on the oxide basis, of about 30–45% SrO, 30–45% $Al_2O_3$, and 20–35% $B_2O_3$. With respect to the $BaO-Al_2O_3-B_2O_3$ system, operable glasses consist essentially, expressed in terms of weight percent on the oxide basis, of about 40–55% BaO, 25–40% $Al_2O_3$, and 15–30% $B_2O_3$.

In general, the most desirable physical properties are exhibited by those compositions consisting essentially solely of CaO and/or SrO and/or BaO, $Al_2O_3$, and $B_2O_3$. Nevertheless, minor amounts of compatible metal oxides, no more than a total of about 15% and, preferably, no more than 10% by weight may be included. For example, MgO, $SiO_2$, $ZrO_2$, $TiO_2$, and ZnO additions can modify the properties demonstrated by the products. Substantial amounts of optional ingredients must be avoided, however, since the development of crystal phases in addition to those desired and/or the development of a low melting glassy phase is hazarded thereby. Because the inclusion of such alkali metal oxides as $Li_2O$, $Na_2O$, and $K_2O$ adversely affects the electrical properties of the glass-ceramic bodies, their essential absence is greatly preferred in products designed for use in electrical applications. Finally, whereas the above discussion has focused on the inventive compositions as being in three individual systems, it will be appreciated that mixtures of two or three of the alkaline earth metal oxides are also contemplated. Such mixtures permit the careful tailoring of the chemical and physical properties of the products from use in a particular application.

In line with the procedure outlined above with respect to forming glass-ceramic bodies through the sintering of powders, the inventive articles are prepared in accordance with the following four general steps:

(1) a glass forming batch of a predetermined composition is melted;

(2) that melt is cooled to a glass and that glass body is comminuted to a very finely-divided powder;

(3) that glass powder is shaped into a body of a desired configuration; and then (4) that body is heated to a temperature and for a time sufficient to sinter the glass particles together into an integral body and to cause the generation of crystals therewithin.

The inventive compositions sinter into an integral body and crystallize in situ almost concurrently. That is, by the time the glass powders have been sintered into a sound body, that body is substantially fully crystallized. Whereas some compositions can be sintered and crystallized at temperatures as low as 700° C., it is well recognized in the art that those operations take place more rapidly at higher temperatures. Hence, firing temperatures between about 700°–1000° C. will conveniently be employed. As can be appreciated, the time required for sintering and crystallization will be governed by the temperature of firing. In general, periods ranging between about 0.5–4 hours have proven satisfactory. Nevertheless, as was observed above, longer firing periods, e.g., 16–24 hours, can lead to more extensive crystallization with some improvement in the properties exhibited by the products.

To reduce the time and energy required to comminuted the glass to fine particles sizes, the melt is frequently poured as a relatively small stream into a water bath. This practice, termed "drigaging," breaks up the stream of molten glass into small particles which can thereafter be milled to the desired grain size.

Prior Art

U.S. Pat. No. 3,899,340 disclosed the production of glass-ceramic bodies demonstrating high elastic moduli consisting essentially, in weight percent, of 5–25% MgO, 10–45% $Al_2O_3$, and 20–45% $B_2O_3$ with, optionally, up to 50% by weight total of a high field strength modifier selected from the group consisting of 0–10% $TiO_2$, 0–40% $Ta_2O_5$, 0–50% $La_2O_3$, 0–25% $CeO_2$, 0–10% $ZrO_2$, 0–35% $Y_2O_3$, and 0–15% BeO. No nucleating agent as such is employed; the crystal phases developed were identified as aluminoborate and magnesiumborate solid solutions. No reference was made to sintering glass powders into a integral body and causing the growth of crystals therein. Rather, a bulk precursor glass body was formed and that body crystallized in situ via heat treatment, the crystals having a different identity from those in the present inventive products. The presence of alkaline earth metal oxides other than MgO was explicitly eschewed since they reduce the elastic moduli of the products.

U.S. Pat. No. 3,948,669 described the preparation of glass-ceramic articles containing single crystal rutile fibers exhibiting high aspect ratios with a secondary crystal phase identified as $Al_4B_2O_9$. The compositions consisted essentially, in weight percent, of 45–65% $B_2O_3$, 5–30% $Al_2O_3$, 5–30% $TiO_2$, and 3–30% RO, wherein RO was selected from the group of MgO, CaO, SrO, and BaO. No mention was made of sintering glass powders into an integral body and effecting the generation of crystals therein, and the crystal phases developed were different from those grown in the present inventive products.

U.S. Pat. No. 4,049,872 was concerned with the formation of devitrifying glass sealing frits consisting essentially, in weight percent, of 10–20% BaO, 10–11% $Li_2O$, 2–7% $Al_2O_3$, and 66–77% $B_2O_3$; wherein the crystal phase developed is $Li_2O.2B_2O_3$. Although sintering of glass powders (frits) was described, the starting compositions and the final products are far removed from those of the instant invention.

DESCRIPTION OF PREFERRED EMBODIMENTS

Table I reports several glass forming compositions, expressed in terms of weight percent on the oxide basis, which are illustrative of the invention. The mole ratio of the components present in each glass is also recorded. The actual batch ingredients may comprise any materials, either the oxides or other compounds, which, when melted together, will be converted into the desired oxide in the proper proportions. For example, $CaCO_3$, $SrCO_3$, and $BaCO_3$ can provide the source of CaO, SrO, and BaO, respectively.

The batch materials were compounded, ball milled together to assist in securing a homogeneous melt, and charged into platinum crucibles of 500 $cm^3$ capacity. Covers were placed thereon and the crucibles were introduced into a furnace operating at about 1600° C. After about two hours, the melt was quenched by either drigaging or by pouring it through water cooled steel rollers.

The quenched glass fragments were further comminuted to powders having an average particle diameter of about 5–10 microns via milling utilizing 0.875" $Al_2O_3$ cylinders as the milling media and methanol as the milling aid. To investigate the sintering and crystallization characteristics of the glass powders, 0.5" diameter discs weighing about 2.5 grams were dry pressed at 2000 psi and fired in an electrically heated furnace between 700°–1000° C. for 0.5–96 hours, the temperature in the furnace being raised at rates varying over the interval of 1°–5° C./minute. After the heat treatment, the electric current to the furnace was cut off and the discs allowed to cool to room temperature within the furnace. This "cooling at furnace rate" averaged about 3°–5° C./minute. Glasses displaying good sintering behaviors, i.e., high density and low porosity, were pressed into bars having dimensions approximating 3"×0.25"×0.25" for measurements of linear coefficient of thermal expansion and modulus of rupture, or into flat discs having diameters approximating 1.75" and thicknesses of 0.125" for measurements of electrical properties.

TABLE I

| Ex. | $B_2O_3$ | $Al_2O_3$ | CaO | Other | Mole Ratio |
|---|---|---|---|---|---|
| 1 | 30.6 | 44.8 | 24.6 | — | $CaO.Al_2O_3.B_2O_3$ |
| 2 | 27.5 | 50.3 | 22.2 | — | $CaO.1.25Al_2O_3.B_2O_3$ |
| 3 | 34.4 | 37.9 | 27.7 | — | $CaO.0.75Al_2O_3.B_2O_3$ |
| 4 | 28.7 | 42.0 | 23.1 | $6.2SiO_2$ | $CaO.Al_2O_3.B_2O_3.0.25SiO_2$ |
| 5 | 35.5 | 41.6 | 22.9 | — | $CaO.Al_2O_3.1.25B_2O_3$ |
| 6 | 21.7 | 42.5 | 23.3 | $12.5SiO_2$ | $CaO.Al_2O_3.0.75B_2O_3.$ $0.5SiO_2$ |
| 7 | 24.6 | 45.0 | 19.8 | $10.6SiO_2$ | $CaO.1.25Al_2O_3.B_2O_3.$ $0.5SiO_2$ |
| 8 | 23.3 | 42.6 | 18.8 | $5SiO_2$, $10.3ZrO_2$ | $CaO.1.25Al_2O_3.B_2O_3.$ $0.25SiO_2.$ $0.25ZrO_2$ |

| Ex. | $B_2O_3$ | $Al_2O_3$ | SrO | Other | Mole Ratio |
|---|---|---|---|---|---|
| 9 | 25.3 | 37.1 | 37.6 | — | $SrO.Al_2O_3.B_2O_3$ |
| 10 | 27.1 | 36.1 | 36.8 | — | $SrO.Al_2O_3.1.1B_2O_3$ |
| 11 | 24.4 | 39.3 | 36.3 | — | $SrO.1.1Al_2O_3.B_2O_3$ |
| 12 | 29.7 | 34.9 | 35.4 | — | $SrO.Al_2O_3.1.25B_2O_3$ |
| 13 | 23.1 | 42.4 | 34.5 | — | $SrO.1.25Al_2O_3.B_2O_3$ |
| 14 | 23.1 | 33.9 | 43.0 | — | $1.25SrO.Al_2O_3.B_2O_3$ |
| 15 | 24.0 | 35.1 | 35.7 | $5.2SiO_2$ | $SrO.Al_2O_3.B_2O_3.0.25SiO_2$ |
| 16 | 23.6 | 34.6 | 35.0 | $6.8TiO_2$ | $SrO.Al_2O_3.B_2O_3.0.25TiO_2$ |
| 17 | 22.7 | 33.3 | 33.9 | $10.1ZrO_2$ | $SrO.Al_2O_3.B_2O_3.0.25ZrO_2$ |
| 18 | 22.2 | 32.6 | 33.2 | $12SnO_2$ | $SrO.Al_2O_3.B_2O_3.0.25SnO_2$ |
| 19 | 22.8 | 33.4 | 34.0 | $9.8SiO_2$ | $SrO.Al_2O_3.B_2O_3.0.5SiO_2$ |

| Ex. | $B_2O_3$ | $Al_2O_3$ | BaO | Mole Ratio |
|---|---|---|---|---|
| 20 | 21.4 | 31.4 | 47.2 | $BaO.Al_2O_3.B_2O_3$ |
| 21 | 24.6 | 30.1 | 45.2 | $BaO.Al_2O_3.1.1B_2O_3$ |
| 22 | 19.9 | 36.4 | 43.7 | $BaO.1.25Al_2O_3.B_2O_3$ |

Table II records the temperature and dwell time at temperature employed in the heat treatment applied to the bar and disc samples, a visual description of the resulting glass-ceramic, the identity of the crystal phase(s) present as determined through X-ray diffractometry, and, where measured, the linear coefficient of thermal expansion (Exp) over the range of 25°–300° C. expressed in terms of $\times 10^{-7}$/°C., the modulus of rupture (MOR) expressed in terms of Ksi, and the dielectric constant (D.C.) and loss tangent (L.T.) determined at room temperature ($\approx 22°$ C.) and 10 KHz. In like manner to the heat treatment (HtTreat) applied to the small investigatory discs described above, the procedure was conducted in an electrically heated furnace employing heating rates averaging about 5° C./minute and "cooling at furnace rate." Where more than one crystal phase was identified, that present in greater amounts is reported first.

the immediate effect of raising the expansion coefficient. Nevertheless, the capability of readily adjusting the coefficient of thermal expansion over a wide range of values can be very useful where sealing to a variety of materials having different expansion coefficients is desired.

I claim:

1. A glass-ceramic article containing an alkaline earth metal aluminoborate of essentially 1.1.1. stoichiometry as the predominant crystal phase, said alkaline earth metal being selected from the group consisting of calcium, strontium, barium, and mixtures thereof, and having a composition essentially free of alkali metal oxides and consisting essentially, expressed in terms of weight

TABLE II

| Ex. | HtTreat | Description | Crystals | Exp | MOR | D.C. | L.T. |
|---|---|---|---|---|---|---|---|
| 1 | 900° C.-1 hr. | Dense, light gray | $\alpha$-CaAl$_2$B$_2$O$_7$ | 14.9 | — | 5.70 | <0.001 |
| 2 | 900° C.-1 hr. | Dense, gray-white | $\alpha$-CaAl$_2$B$_2$O$_7$ | 20.7 | — | — | — |
| 3 | 900° C.-1 hr. | Dense, white | $\alpha$-CaAl$_2$B$_2$O$_7$ | 23.4 | — | — | — |
| 4 | 900° C.-1 hr. | Dense, gray-white, slightly rounded | $\alpha$-CaAl$_2$B$_2$O$_7$ | 25.4 | 15.8 | 5.40 | <0.001 |
| 5 | 900° C.-1 hr. | Dense, white, tough | $\beta$-CaAl$_2$B$_2$O$_7$ $\alpha$-CaAl$_2$B$_2$O$_7$ | 20.1 | — | — | — |
| 6 | 900° C.-1 hr. | Dense, white, some sag, tough | $\alpha$-CaAl$_2$B$_2$O$_7$ | 37.4 | 21.2 | — | — |
| 7 | 900° C.-1 hr. | Dense, white, translucent, slightly rounded edges, tough | $\alpha$-CaAl$_2$B$_2$O$_7$ 9Al$_2$O$_3$ 2B$_2$O$_3$ | 39.9 | 18.8 | — | — |
| 8 | 900° C.-1 hr. | Dense, white, rounded edges, tough | $\alpha$-CaAl$_2$B$_2$O$_7$ | 29.6 | — | — | — |
| 9 | 900° C.-1 hr. | Dense, light gray | $\beta$-SrAl$_2$B$_2$O$_7$ $\alpha$-SrAl$_2$B$_2$O$_7$ | 8.3 | — | 5.64 | 0.002 |
| 10 | 900° C.-16 hrs. | Dense, gray-white | — | 7.2 | — | — | — |
| 11 | 900° C.-1 hr. | Dense, white | $\beta$-SrAl$_2$B$_2$O$_7$ $\alpha$-SrAl$_2$B$_2$O$_7$ | 8.0 | — | — | — |
| 11 | 900° C.-16 hrs. | Dense, white, slightly rounded edges | — | 6.4 | — | — | — |
| 12 | 900° C.-1 hr. | Dense, white | $\beta$-SrAl$_2$B$_2$O$_7$ | 15.5 | — | — | — |
| 13 | 1000° C.-1 hr. | Dense, white, semi-gloss | $\beta$-SrAl$_2$B$_2$O$_7$ $\alpha$-SrAl$_2$B$_2$O$_7$ | 10.4 | — | — | — |
| 14 | 900° C.-1 hr. | Dense, gray-white, hydrophobic | $\beta$-SrAl$_2$B$_2$O$_7$ $\alpha$-SrAl$_2$B$_2$O$_7$ | 30.7 | — | — | — |
| 15 | 900° C.-1 hr. | Dense, gray-white, hydrophobic | $\alpha$-SrAl$_2$B$_2$O$_7$ | 27.8 | — | — | — |
| 16 | 900° C.-1 hr. | Dense, gray-beige-white | $\beta$-SrAl$_2$B$_2$O$_7$ $\alpha$-SrAl$_2$B$_2$O$_7$ | 14.9 | — | — | — |
| 17 | 900° C.-1 hr. | Dense, white | $\beta$-SrAl$_2$B$_2$O$_7$ $\alpha$-SrAl$_2$B$_2$O$_7$ SrZrO$_3$ | 16.9 | — | — | — |
| 18 | 900° C.-1 hr. | Dense, light brown | $\beta$-SrAl$_2$B$_2$O$_7$ $\alpha$-SrAl$_2$B$_2$O$_7$ SnO$_2$ | 12.4 | — | — | — |
| 19 | 900° C.-1 hr. | Dense, gray-white, semi-glass, tough, translucent | $\alpha$-SrAl$_2$B$_2$O$_7$ | 41.3 | — | — | — |
| 20 | 800° C.-1 hr. | Dense, light gray | BaAl$_2$B$_2$O$_7$ | 23.4 | — | 5.67 | 0.009 |
| 21 | 900° C.-1 hr. | Dense, white, rounded edges | BaAl$_2$B$_2$O$_7$ | 31.2 | — | — | — |
| 22 | 800° C.-1 hr. | Dense, white | BaAl$_2$B$_2$O$_7$ | 26.8 | — | — | — |

As is apparent from an examination of Tables I and II, glass-ceramics exhibiting the lowest coefficients of thermal expansion have compositions consisting essentially solely of alkaline earth oxide, Al$_2$O$_3$, and B$_2$O$_3$ in essentially a 1:1:1 molar ratio. Hence, substantial excursions away from that stoichiometry lead to products of much higher expansion coefficients. Likewise, additions of even minor amounts of additional materials tend to have percent on the oxide basis, selected from the group consisting of:

(a) 20–30% CaO, 35–55% $Al_2O_3$, and 20–40% $B_2O_3$;

(b) 30–45% SrO, 30–45% $Al_2O_3$, and 20–35% $B_2O_3$;

(c) 40–55% BaO, 25–40% $Al_2O_3$, and 15–30% $B_2O_3$; and (d) mixtures thereof.

2. A method according to claim 1 wherein the concentration of each of CaO, SrO, BaO, $Al_2O_3$, and $B_2O_3$ is maintained within ±0.25 mole of 1.1.1 stoichiometry.

* * * * *